(12) United States Patent
Abbott

(10) Patent No.: US 6,245,448 B1
(45) Date of Patent: Jun. 12, 2001

(54) LEAD FRAME WITH REDUCED CORROSION

(75) Inventor: Donald Charles Abbott, North Attleboro, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/190,729

(22) Filed: Feb. 2, 1994

Related U.S. Application Data

(63) Continuation of application No. 08/106,327, filed on Aug. 13, 1993, now abandoned, which is a continuation of application No. 08/018,359, filed on Feb. 16, 1993, now abandoned, which is a continuation of application No. 07/839,750, filed on Feb. 20, 1992, now abandoned, which is a continuation of application No. 07/566,788, filed on Aug. 13, 1990, now abandoned, which is a continuation of application No. 07/174,060, filed on Mar. 28, 1988, now abandoned.

(51) Int. Cl.⁷ .......................... H01L 23/50; H01L 23/495
(52) U.S. Cl. .................... 428/670; 428/675; 428/680; 428/929; 427/125; 257/677
(58) Field of Search ........................... 428/615, 620, 428/671, 670, 680, 668, 674, 675, 931, 933; 427/405, 125; 257/677

(56) References Cited

U.S. PATENT DOCUMENTS

| | | | |
|---|---|---|---|
| 2,886,499 | * | 5/1959 | Schaer et al. ...................... 357/67 |
| 3,684,464 | * | 8/1972 | Happ et al. ........................ 357/70 |
| 4,141,029 | * | 2/1979 | Dromsky .......................... 357/70 |
| 4,529,667 | * | 7/1985 | Shiga et al. ....................... 357/70 |
| 4,590,672 | * | 5/1986 | Shimizu et al. ................... 357/70 |
| 4,601,958 | * | 7/1986 | Levine ............................ 428/519 |
| 4,666,796 | * | 5/1987 | Levine ............................ 428/670 |
| 4,707,724 | * | 11/1987 | Suzuki et al. ..................... 357/70 |
| 4,835,067 | * | 5/1989 | Levine ............................ 428/669 |
| 4,895,771 | * | 1/1990 | Souter et al. ..................... 428/672 |

FOREIGN PATENT DOCUMENTS

| | | | | |
|---|---|---|---|---|
| 250146 | * | 12/1987 | (EP) | ........................ 357/70 |
| 96662 | * | 7/1980 | (JP) | ........................ 357/70 |
| 36953 | * | 2/1984 | (JP) | ........................ 357/70 |
| 36954 | * | 2/1984 | (JP) | ........................ 357/70 |
| 168659 | * | 9/1984 | (JP) | ........................ 357/70 |
| 143636 | * | 7/1985 | (JP) | ........................ 357/70 |
| 61-96088 | | 9/1986 | (JP) | ................... C23F/1/00 |

\* cited by examiner

*Primary Examiner*—John J. Zimmerman
(74) *Attorney, Agent, or Firm*—Mark Courtney; W. James Brady; Frederick J. Telecky, Jr.

(57) ABSTRACT

A palladium plated lead frame (34) for integrated circuit devices has a nickel strike (36) and a palladium/nickel alloy layer (38) separating the copper base metal (28) from the nickel intermediate layer (40) in order to prevent a galvanic potential from drawing copper ions from the base metal layer (28) to the top layer (42). The nickel strike (36) and palladium/nickel alloy layer (38) also reduce the number of paths through which a copper ion could migrate to the top surface resulting in corrosion.

44 Claims, 2 Drawing Sheets

LEAD FRAME WITH REDUCED CORROSION

This application is a Continuation of application Ser. No. 08/106,327 (which is a continuation of Ser. No. 08/018,359 filed Feb. 16, 1993 now abandoned which is a continuation of Ser. No. 07/839,750 filed Feb. 20, 1992 now abandoned which is a continuation of Ser. No. 07/566,788 filed Aug. 13, 1990 now abandoned which is a continuation of Ser. No. 07/174,060 filed Mar. 28, 1988 now abandoned), filed Aug. 13, 1993 abandoned.

TECHNICAL FIELD OF THE INVENTION

This invention relates in general to integrated circuits, and more particularly to integrated circuit devices having reduced galvanic migration of corrosive products.

BACKGROUND OF THE INVENTION

In the construction of integrated circuit devices, lead frames are used to provide electrical interconnection to a semiconductor circuit. Typically, the base metal of the lead frame is copper because of its high thermal conductivity. Other base metals include stainless steel and Alloy 42, which is an alloy of 42% nickel and 58% iron. In some instances, a nickel layer on the order of 100 microinches is formed over the base metal to prevent temperature driven diffusion of the copper to the surface of the lead frame. Corrosion products formed by copper diffusion, such as copper sulfides and oxides, will degrade the solderability of the lead frame and will reduce the shelf life of the final product.

The nickel layer, however, contains pores through which the corrosion products may migrate. A nickel layer thickness of at least 400 microinches would be needed to reasonably assure that no continuous paths through the nickel layer would be available for copper migration. Unfortunately, a thickness of this magnitude will crack when the leads are eventually bent to form the dual inline package (DIP) or surface mount integrated circuit (SMIC).

A layer of palladium (Pd) may be formed over the nickel layer. The palladium top surface may be thermosonically bonded to gold wire, providing a stronger bond than available with a silver lead end. Furthermore, palladium will not tarnish or oxidize in air, thus retaining a clean bonding surface indefinitely. The palladium layer, however, will produce a galvanic potential between the palladium layer and the copper base, drawing copper ions to the surface. This galvanic couple accelerates pore corrosion in the palladium plated lead frame, which results in oxides and sulfides and other reaction products of copper appearing on the lead frame surface. The oxides and sulfides and other corrosion products discolor the surface of the lead frame and degrade its solderability.

Therefore, a need has arisen to provide an integrated circuit lead frame with reduced galvanic potential for preventing surface corrosion.

SUMMARY OF THE INVENTION

In accordance with the present invention, a lead frame is provided which substantially eliminates or prevents the disadvantages and problems associated with prior lead frames.

The lead frame of the present invention provides a palladium plated lead frame which may be used with a copper base metal, or other base metal, without contamination of the top surface due to a galvanic potential between the palladium top surface and the base metal. A palladium/nickel alloy layer separates the base metal from a nickel intermediate layer which is used to prevent thermal diffusion of the base metal atoms to the upper surface. The palladium/nickel alloy layer minimizes the galvanic potential across the nickel intermediate layer, thereby preventing migration of the base metal ions to the top surface. Corrosion products formed in the palladium/nickel alloy layer due to the potential between the palladium/nickel alloy layer and the base metal will be neutral and insoluble; therefore, they will not migrate through the nickel intermediate to the top surface.

This aspect of the present invention provides the technical advantage of a palladium plated lead frame which is not subject to corrosion due to galvanic potential forces aiding the migration of the base metal ions to the top surface where they will form corrosion products.

In another aspect of the present invention, a nickel strike layer is formed between the base metal and the palladium/nickel alloy layer in order to prevent contamination of the palladium/nickel bath used to form the palladium/nickel alloy layer. The nickel strike in conjunction with the palladium/nickel layer also provides the technical advantage of reducing the porosity of the material between the base metal and the palladium top layer, thereby minimizing the paths through which a base metal ion could migrate.

BRIEF DESCRIPTION OF THE DRAWINGS

For a more complete understanding of the present invention and the advantages thereof, reference is now made to the following description now taken in conjunction with the accompanying drawings in which.

DETAILED DESCRIPTION OF THE INVENTION

Figure 1:
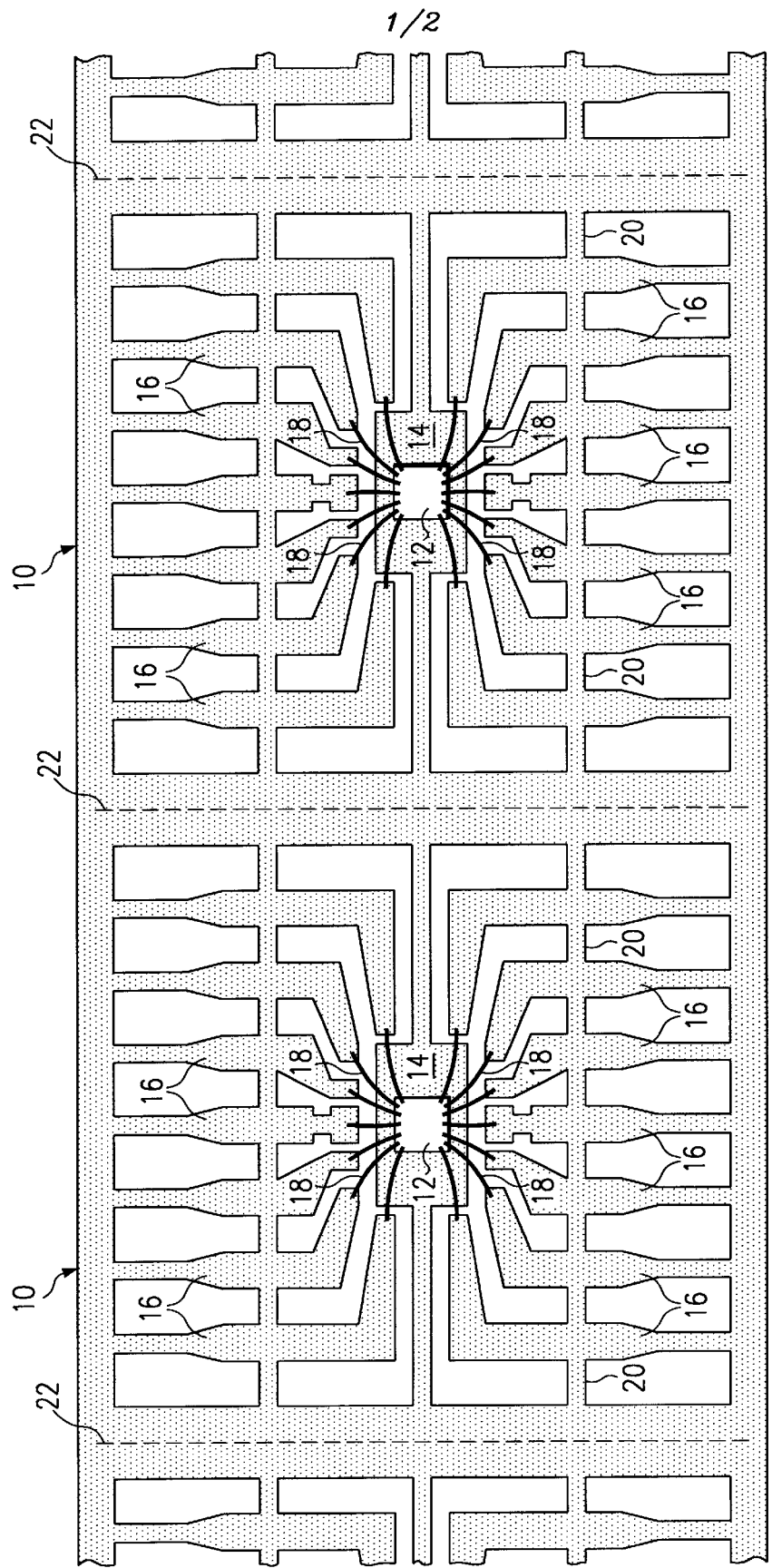
FIG. 1 is a top plan view of a lead frame.
Figure 2:
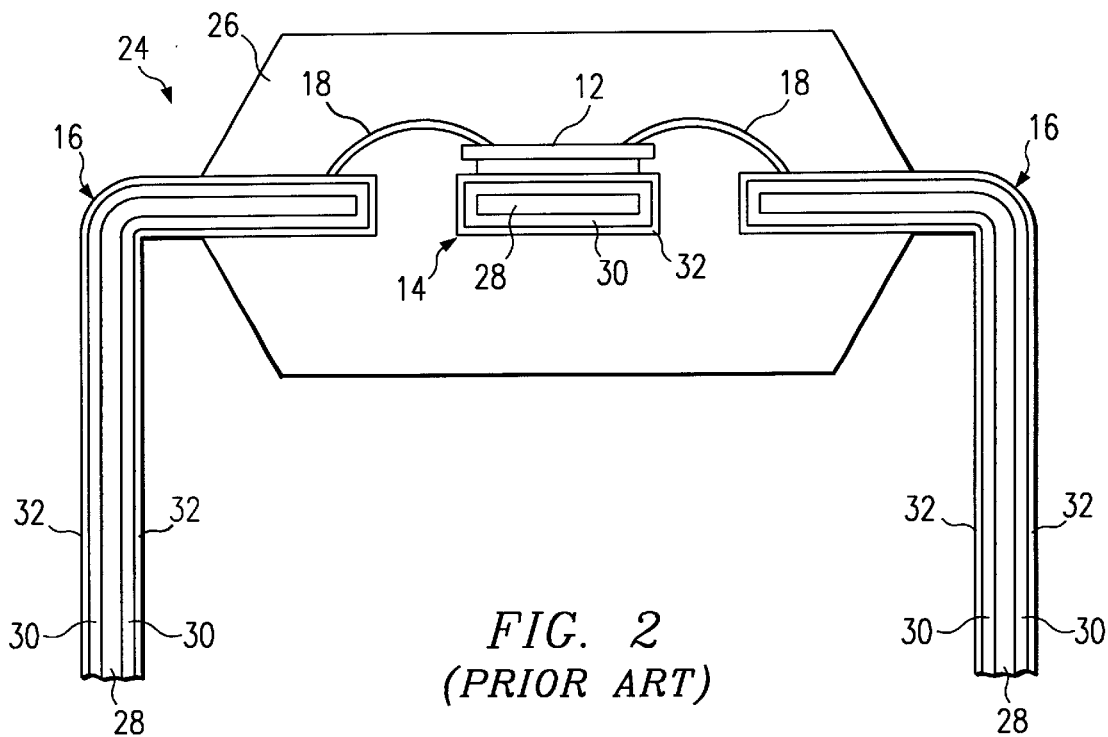
FIG. 2 is a cross-sectional side view of a prior art lead frame.
Figure 3:
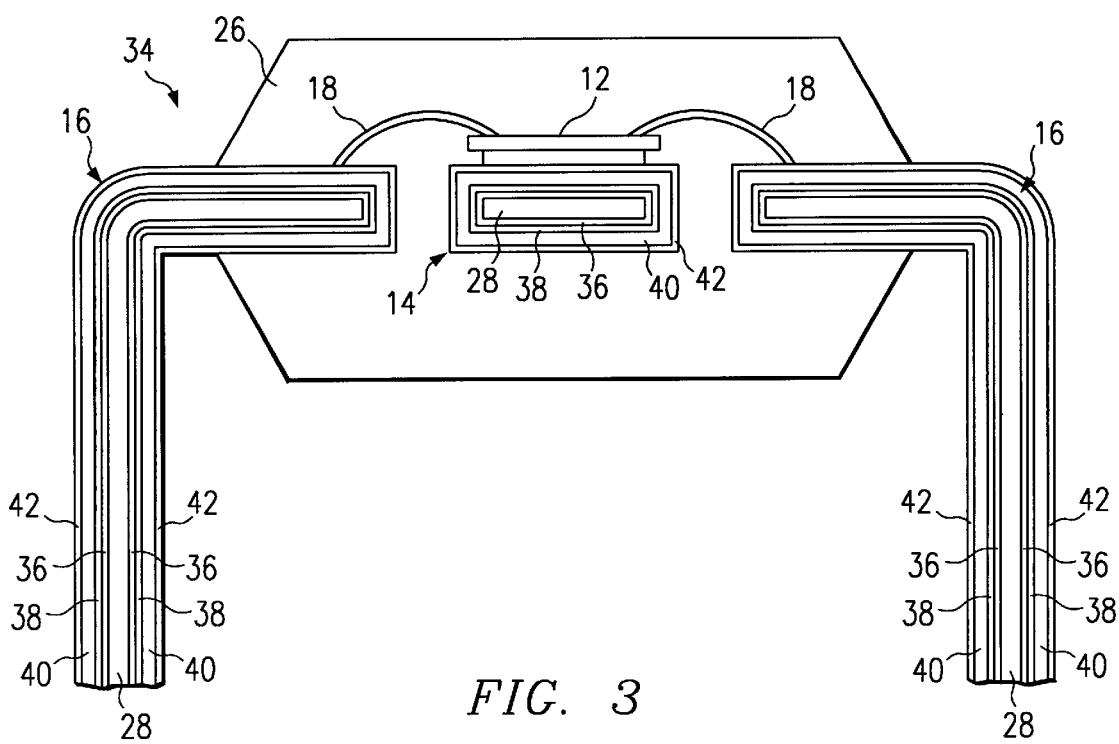
FIG. 3 is a cross-sectional view of the lead frame of the present invention.

The preferred embodiment of the present invention is best understood by referring to FIGS. 1–3 of the drawings, like numerals being used for like and corresponding parts of the various drawings.

FIG. 1 illustrates a top view of a typical lead frame 10 used to support a semiconductor circuit 12. The lead frame 10 comprises a platform 14 on which the semiconductor circuit 12 is bonded. The semiconductor circuit 12 is connected to the external leads 16 using fine wire 18, typically made of gold. Dam bars 20 connect the external leads 16, but are subsequently trimmed away after a packaging medium has been applied. As shown in FIG. 1, lead frames 10 are typically connected to each other by connecting strips 22 for mass production.

FIG. 2 illustrates a cross-sectional view of a prior art lead frame 24 enclosed in packaging material 26. The platform 14 and external leads 16 are shown as comprised of a base metal 28 enclosed in a intermediate layer 30 which is covered by a top layer 32. Typically, the base metal 28 comprises copper, the intermediate layer 30 comprises nickel and the top layer 32 comprises palladium. The gold wires 18 may be connected directly to the palladium top layer 32 without the need for a silver coating.

Assuming a top layer 32 of palladium (Pd) and a base metal 28 of copper (Cu), a galvanic potential will exist between the top layer 32 and the base metal 28 due to the differences in their respective standard reduction potentials. A galvanic cell is thus created, with the nickel intermediate layer acting as the electrolyte. The galvanic potential will draw copper ions through the pores of the nickel layer to the top layer 32. Hence, the copper ions will be pulled to the palladium top layer 32, through the nickel intermediate layer 30, accelerating pore corrosion in the palladium top layer 32. Consequently, oxides and sulfides and other reaction products of copper may form on the surface of the top layer 32, causing discoloration of the surface and degrading its solderability.

FIG. 3 illustrates the lead frame 34 of the present invention. The base metal 28, typically copper, is covered by a strike layer 36, typically a nickel strike. The nickel strike layer 36 is covered by a palladium/nickel alloy layer 38. The alloy layer 38 is covered by a intermediate layer 40, typically nickel. The intermediate layer 40 is covered by a top layer 42, typically comprising palladium.

The nickel strike layer 36 formed over the base metal is provided to prevent contamination of the subsequent palladium/nickel baths which is used to form the alloy layer 38. The nickel strike layer 36 also helps to minimize the number of pores through which a path can be formed in the intermediate layer 40. Typically, the nickel strike layer 36 has a thickness of less than 5 microinches.

The palladium/nickel alloy layer 38 typically has a thickness of less than 3 microinches. The purpose of the palladium/nickel alloy layer 38 is to decouple the galvanic potential between the copper base metal 28 and the palladium top layer 42. By virtue of the palladium/nickel alloy layer 38, the potential across the nickel layer 40 is reduced substantially to zero, since the galvanic potentials of the palladium top layer 42 is the same as the galvanic potential of the palladium/nickel alloy. Therefore, the present invention provides the technical advantage of preventing migration of base metal ions to the top layer under the force of a galvanic potential.

However, it is possible that corrosion products may form under the palladium/nickel alloy layer 38, due to the galvanic potential between the palladium/nickel alloy layer 38 and the copper base metal 28. Thus, it is possible that copper sulfide or copper chloride or other reaction products may form on the palladium/nickel alloy layer 38; however, these compounds are electrically neutral and insoluble, and are therefore unlikely to diffuse through the nickel intermediate layer 40.

In addition to reducing the galvanic potential, the nickel strike layer 36 and palladium/nickel alloy layer 38 decrease the porosity of the intermediate nickel layer 40. The decreased porosity provides the technical advantage of further reducing the possibility of a contaminant reaching the top layer 42.

Because of the decreased porosity and decreased galvanic potential, a thinner nickel intermediate layer 40 may be used without fear of copper ion migration.

Although the present invention has been described in detail, it should be understood that various changes, substitutions and alterations can be made herein without departing from the spirit and scope of the invention as defined by the append claims.

What is claimed is:

1. A lead frame for an integrated circuit, comprising:
   a base metal layer having a first standard reduction potential;
   an isolation layer disposed upon said base metal layer and having a second standard reduction potential, said second standard reduction potential being greater than said first standard reduction potential;
   an intermediate layer disposed upon said isolation layer and having a third standard reduction potential, said third standard reduction potential being less than both said first and second standard reduction potentials; and
   a top metal layer disposed upon said intermediate layer and having a standard reduction potential substantially equal to said second standard reduction potential.

2. The lead frame of claim 1 wherein said base metal layer includes copper.

3. The lead frame of claim 1 wherein said isolation layer includes palladium.

4. The lead frame of claim 1 wherein said isolation layer is less than 3 microinches thick.

5. The lead frame of claim 3 wherein said intermediate layer includes nickel.

6. The lead frame of claim 1 wherein said metal top layer is comprised of one of the group consisting of palladium, osmium, ruthenium, iridium.

7. The lead frame of claim 1 wherein said metal top layer includes palladium.

8. The lead frame of claim 5 wherein said metal top layer is comprised of ruthenium.

9. The lead frame of claim 8 wherein said base metal layer is copper.

10. A corrosion resistant lead frame for an integrated circuit, comprising:
    a base metal layer having a first standard reduction potential;
    a strike layer disposed upon said base metal layer;
    an isolating layer disposed upon said strike layer and having a second standard reduction potential, said second standard reduction potential being greater than said first reduction potential;
    an intermediate layer disposed upon said isolating layer and having a third standard reduction potential, said third standard reduction potential being less than said first and second standard reduction potentials; and
    a metal top layer disposed upon said intermediate layer and having a standard reduction potential substantially equal to said second standard reduction potential.

11. The lead frame of claim 10 wherein said base metal layer includes copper.

12. The lead frame of claim 11 wherein said isolation layer includes palladium.

13. The lead frame of claim 12 wherein said intermediate layer includes nickel.

14. The lead frame of claim 13 wherein said metal top layer is comprised of one of the group consisting of palladium, osmium, ruthenium, and iridium.

15. The lead frame of claim 12 wherein said metal top layer is comprised of palladium.

16. The lead frame of claim 10 wherein said metal top layer is comprised of palladium.

17. The lead frame of claim 10 wherein said metal top layer is comprised of ruthenium.

18. The lead frame of claim 13 wherein said isolation layer is less than 3 microinches.

19. The lead frame of claim 13 wherein said strike layer is comprised of nickel.

20. The lead frame of claim 13 wherein said strike layer is less than 5 microinches.

21. The lead frame of claim 16 wherein said strike layer is less than 5 microinches.

22. An integrated circuit, comprising:

a semiconductor circuit;

packaging material encapsulating said semiconductor circuit; and leads extending from said packaging material, each lead coupled to said semiconductor circuit and each including:
- a base layer comprised of a metal including copper;
- a nickel strike layer disposed upon said base layer;
- an isolating layer comprised of a metal including palladium disposed upon said strike layer;
- an intermediate layer comprised of a metal including nickel disposed upon said isolating layer; and
- a metal top layer comprised of a metal including palladium disposed upon said intermediate layer.

23. The lead frame of claim 22 wherein the strike layer is less than 5 microinches.

24. The lead frame of claim 22 wherein the isolation layer is less than 3 microinches.

25. A lead frame for use in electrically contacting an integrated circuit, comprising:

a platform for supporting a semiconductor circuit;

a plurality of leads attached to said platform, each of said leads comprising:
(a) a base metal layer;
(b) a strike layer disposed upon said base metal layer;
(c) an isolation layer disposed upon said strike layer;
(d) an intermediate layer disposed upon said isolation layer; and
(e) a metal top layer disposed upon said intermediate layer;

wherein the standard reduction potential of said isolating layer is greater than the standard reduction potential of said metal base layer and substantially equal to the standard reduction potential of said metal top layer, and the standard reduction potentials of said metal base layer is greater than the standard reduction potential of said intermediate layer.

26. The lead frame of claim 25 wherein the base metal layer includes copper.

27. The lead frame of claim 26 wherein the strike layer includes nickel.

28. The lead frame of claim 27 wherein the isolation layer includes palladium.

29. The lead frame of claim 28 wherein the intermediate layer includes nickel.

30. The lead frame of claim 29 wherein the top layer includes palladium.

31. A method of producing a lead frame for an integrated circuit, comprising the steps of:

providing a base metal layer having a first standard reduction potential;

forming an isolation layer upon said base metal layer, said isolation layer having a second standard reduction potential that is greater than said first standard reduction potential;

forming an intermediate layer upon said isolation layer, said intermediate layer having a third standard reduction potential that is less than said first standard reduction potential; and forming a top metal layer upon said intermediate layer, said top metal layer having a standard reduction potential substantially equal to said second standard reduction potential.

32. The method of claim 31, wherein said step of providing a base metal layer comprises the step of providing a metal layer that is one of the group consisting of copper and copper alloy.

33. The method of claim 32, wherein said step of forming an isolation layer comprises the step of providing one of the group consisting of palladium and palladium alloy.

34. The method of claim 33, wherein said step of forming an intermediate layer comprises the step of providing one of the group consisting of nickel and nickel alloy.

35. The method of claim 34, wherein said step of forming a top layer comprises the step of providing one of the group consisting of palladium and palladium alloy.

36. The method of claim 35, wherein said step of forming a top layer comprises the step of providing one of the group consisting of palladium, ruthenium, iridium and osmium.

37. A method of producing a lead frame for an integrated circuit, comprising the steps of:

providing a base metal layer having a first standard reduction potential;

disposing a nickel strike layer upon said base metal layer;

disposing an isolation layer upon said strike layer, said isolation layer having a second standard reduction potential that is greater than said first standard reduction potential;

disposing an intermediate layer upon said isolation layer, said intermediate layer having a third standard reduction potential that is less than the first and second standard reduction potentials; and disposing a metal top layer upon said intermediate layer, said metal top layer having a standard reduction potential substantially equal to said third standard reduction potential.

38. The method of claim 37, wherein said step of providing a base metal layer comprises the step of providing one of the group consisting of copper and copper alloy.

39. The method of claim 38, wherein said step of forming a strike layer comprises the step of providing nickel.

40. The method of claim 39, wherein said step of forming an isolation layer comprises the step of providing one of the group consisting of palladium and palladium alloy.

41. The method of claim 40, wherein said step of forming an intermediate layer comprises the step of providing one of the group consisting of nickel and nickel alloy.

42. The method of claim 41, wherein said step of forming a top layer comprises the step of providing one of the group consisting of palladium and palladium alloy.

43. The method of claim 37, wherein said step of forming a strike layer comprises the step of forming a layer that is less than 5 microinches thick.

44. The method of claim 37, wherein said step of forming an isolation layer comprises the step of forming a layer that is less than 3 microinches thick.

* * * * *